United States Patent
Fujii

(10) Patent No.: US 6,462,401 B2
(45) Date of Patent: Oct. 8, 2002

(54) SEMICONDUCTOR WAFER HAVING A BANK ON A SCRIBE LINE

(75) Inventor: Moyuru Fujii, Shiga (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/816,229

(22) Filed: Mar. 26, 2001

(65) Prior Publication Data

US 2001/0035567 A1 Nov. 1, 2001

(30) Foreign Application Priority Data

Mar. 27, 2000 (JP) .................................. 2000-090708

(51) Int. Cl.$^7$ ............................................... H01L 23/544
(52) U.S. Cl. ...................... 257/620; 257/620; 438/14; 438/106; 438/156; 438/763
(58) Field of Search ..................... 257/620; 438/14, 438/763, 106; 430/394; 428/156

(56) References Cited

U.S. PATENT DOCUMENTS 5,414,297 A * 5/1995 Morita et al. ................ 257/620
5,641,714 A * 6/1997 Yamanaka .................... 438/14
5,723,385 A * 3/1998 Shen et al. ................... 438/763
5,824,457 A * 10/1998 Liu et al. ..................... 430/394
6,207,473 B1 * 3/2001 Hirai et al. ................... 438/106
6,214,441 B1 * 4/2001 Liu et al. ..................... 428/156

FOREIGN PATENT DOCUMENTS

JP          61-232625          10/1986

* cited by examiner

Primary Examiner—David Nelms
Assistant Examiner—Mai-Huong Tran
(74) Attorney, Agent, or Firm—McGinn & Gibb, PLLC

(57) ABSTRACT

A semiconductor wafer includes a plurality of chips arranged in a matrix and a plurality of scribe lines separating the chips from one another. A polyimide overcoat film covering each chip except for electrode pads of the chip has a bank crossing the scribe line for preventing the ground particles generated by grinding the bottom surface of the wafer from entering the chip along the scribe lines.

6 Claims, 4 Drawing Sheets

SEMICONDUCTOR WAFER HAVING A BANK ON A SCRIBE LINE

BACKGROUND OF THE INVENTION (a) Field of the Invention

The present invention relates to a semiconductor wafer and a method for fabricating a semiconductor wafer and, more particularly, to an improvement of the semiconductor wafer for preventing ingress of particles generated by grinding the bottom surface of the wafer.

(b) Description of the Related Art

Some semiconductor wafers are formed by a process including the steps of forming polyimide overcoat film patterns for protecting the main surfaces of semiconductor chips and grinding the bottom surface of the wafer after the polyimide film patterns are formed on the main surfaces.

A conventional method of fabricating such a semiconductor wafer will be described with reference to FIGS. 1 and 2. FIG. 1 is a top plan view showing a part of the main surface of the conventional semiconductor wafer having thereon a polyimide overcoat film pattern on each of the semiconductor chips. FIG. 2 is a sectional view taken along line II—II in FIG. 1, showing the wafer onto which a surface protective tape 19 is stuck after formation of the polyimide film patterns 18.

The semiconductor wafer has thereon a plurality of semiconductor chips 11 arranged in a matrix. The fabrication process of the wafer shown includes the step of forming insulating films 14 on the substrate 13, followed by forming thereon an interconnect pattern 16 including electrode pads 15. Scribe lines 17 are then formed between each adjacent two of the semiconductor chips 11. The scribe lines 17 is used for cutting the wafer in a later dicing step in which the semiconductor wafer is scribed and separated into separate semiconductor chips 11.

Polyimide film patterns 18 are formed as overcoat layers for protecting the interconnect patterns 16 against damages or contamination. The polyimide film forming step typically includes such procedures as polyimide coating, polyimide hardening, resist coating, exposure to light, selective removal of the resist layer for patterning, selective etching of the polyimide film using the resist layer as a mask, and removal of the resist layer.

For patterning the polyimide film, the polyimide film is removed from most of the areas for all the electrode pads 15, the areas of the scribe lines 17, and, if any electrode pads 15 and scribe lines 17 are disposed in close proximity to one another, the gaps therebetween. The purpose of the removal of the polyimide film from the areas of the scribe lines 17 is to prevent the dicing blade used in the dicing step from a premature deterioration in sharpness. The areas of the electrode pads 15 should be exposed for the sake of bonding in a bonding step, and thus are subjected to the removal of the polyimide film.

The polyimide film patterns 18 have a certain thickness so as to protect the interconnect patterns 16 from damages and contamination. The polyimide film patterns 18 are formed in a thickness greater than or equal to 6 $\mu$m, which is significantly greater as compared with those of the insulating films 14 and interconnect patterns 16 which are not greater than 2 $\mu$m. Thus, the surface of the wafer having thereon the polyimide film patterns 18 is projected where the polyimide film patterns 18 exist, and depressed where no polyimide film 18 exist. Parallel to the scribe lines 17, these depressions extend vertically and horizontally to form a lattice.

Further, if any electrode pads 15 and scribe lines 17 are disposed in close proximity to one another and thus no polyimide film 18 is formed therebetween, the depressions over those electrode pads 15 and the depressions over those scribe lines 17 are coupled together. These depressions create gaps 20, for example, between the wafer and the surface protective tape 19 which is stuck onto the wafer during grinding the bottom surface of the wafer.

FIG. 3 is a side view showing the grinding position in a bottom surface grinder 21 for use in the step of bottom surface grinding in the fabrication process of the semiconductor wafer. The bottom surface grinder 21 has a suction table 22 and a high-speed rotation wheel 23 in its grinding position. The wafer 12 having thereon the polyimide film patterns onto which the surface protective tape 19 are stuck is attached to the suction table 22, with the main surface (top surface) of the wafer 12 being directed downward. The high-speed rotation wheel 23 rotates at a high speed to grind the bottom surface of the wafer 12. The high-speed rotation wheel 23 has a plurality of grindstones 25 protruding therefrom.

Nozzles 26 for spraying water are arranged right inside the grindstones 25. Aside from the grinding position, the bottom surface grinder 21 has a cleaning position (not shown) for cleaning particles 24 produced by the grinding. The bottom surface grinder 21 is used to grind the bottom surface of the semiconductor wafer 12 to a desired thickness in the following manner.

That is, the wafer 12 having the surface protective tape 19 stuck thereon is attached to the suction table 22 with the top surface of the wafer 12 being directed downward. The high-speed rotation wheel 23 having the grindstones 25 is lowered to the height of the bottom surface of the wafer 12 and rotated at a high speed, so as to grind the bottom surface of the wafer 12. Formed inside the grindstones 15 are the nozzles 26 for ejecting water to wash away the ground particles 24 produced by the grinding and to cool down the frictional heat produced by the grinding. The nozzles 26 eject water to wash away the ground particles 24. There are some other methods which includes a grinding step without the supply of water. After the bottom surface grinding, the wafers are cleaned in the cleaning position (not shown), drained, and stored in a storage box in the order of the appearance.

In the conventional method in which all the steps up to the patterning of the polyimide film are completed before the bottom surface grinding, since the polyimide film is already removed from the areas for the electrode pads 15 and the scribe lines 17 to make depressions, the gaps 20 are generated between the surface of the wafer 12 having thereon the polyimide film patterns 18 and the surface protective tape 19.

Due to the presence of the gaps 20, the particles 24 produced by the bottom surface grinding, mixed with the water or air and washed around from the bottom surface to the side surface of the wafer 12, may intrude into the interior of the wafer through gaps 20 from the periphery of the wafer. Moreover, by the capillary function, the water/air containing the ground particles 24 flows onto the main surface of the wafer along the scribe lines 17 which extend vertically and horizontally to form a lattice and are in connection with one another.

On the way of flow, the ground particles 24 adhere to the electrode pads 15 having depressions which lead to the scribe lines 17. Of the ground particles 24, hard and pointed ones stick into the electrode pads 15, which are formed of relatively soft material. This wafer is cleaned in the cleaning position (not shown) after the bottom surface grinding, whereas the ground particles 24 intruding into the gaps 20 and adhered thereto are eliminated insufficiently. Although there is another cleaning step (not shown) after the removal of the surface protective tape 19, the ground particles 24, sticking into the electrode pads 15, are hard to remove completely.

Patent Publication JP-A-61-232625 describes another method including the steps of preparing a wafer having thereon a polyimide film covering the entire surface of the wafer including the scribe lines and electrode pads, grinding the wafer in the bottom surface grinding step, and entirely removing the polyimide film by etching. This technique eliminates the problem that the pasting wax for pasting the wafer to the table of the bottom surface grinder reacts with the electrode pads to discolor the electrode pads. In addition, a problem of damage to the electrode pads can also be avoided. Moreover, even in the cases where the wafer on which the interconnect patterns are formed has silver bump plating layers having projections and depressions of 20–50 $\mu$m on its surface, the surface of the wafer is flattened by coating the polyimide film having a greater thickness.

This prevents generation of cracks in wafer due to the projections and depressions on the surface of the wafer when the wafer is pasted during the bottom surface grinding.

In the conventional fabrication method described in the patent publication mentioned above, the entire surface of the wiring-patterned wafer is covered with the polyimide during the bottom surface grinding, and thus produces no projections/depressions due to the presence/absence of the polyimide film patterns. This prevents ground particles from adhering to the electrode pads, and the polyimide film is removed after the bottom surface grinding step.

However, the described technique is not directed to a wafer having thereon polyimide film patterns for protecting the product semiconductor device, because the polyimide film is used as a temporary protective film and entirely removed from the wafer after the bottom surface grinding. The present invention is directed to solving the problem involved in the first conventional method wherein the bottom surface grinding is conducted after patterning of the polyimide overcoat film.

SUMMARY OF THE INVENTION

An object of the present invention is to provide a process for fabricating a semiconductor wafer including a bottom surface grinding step, which is capable of preventing the ground particles produced in the bottom surface grinding step from contaminating the electrode pads formed on the semiconductor wafer.

The present invention provides a method for fabricating a semiconductor wafer, including the consecutive steps of forming a wafer having thereon a plurality of semiconductor chips arranged in a matrix and a plurality of scribe lines separating the semiconductor chips from one another, each of the semiconductor chips including an interconnect pattern having electrode pads, forming an overcoat film pattern on each of the chips except for at least effective areas for the electrode pads, the overcoat film pattern having a bank portion bridging the overcoat film pattern and an adjacent overcoat film pattern while crossing one of the scribe lines, and grinding a bottom surface of the wafer.

The present invention also provides a semiconductor wafer comprising: a plurality of semiconductor chips arranged in a matrix and each having an interconnect pattern including electrode pads and an overcoat film for covering the semiconductor chip except for at least parts of the electrode pads; and a plurality of scribe lines for separating the semiconductor chips from one another, at least one of the overcoat films having a bank portion bridging the at least one of the overcoat films and an adjacent one of the overcoat films while crossing one of the scribe lines.

The semiconductor wafer according to the present invention and the semiconductor wafer fabricated by the fabrication method according to the present invention can suppress the ingress of ground particles by the function of the bank portions through the scribe lines during the bottom surface grinding step, and prevent the electrode pads from being contaminated or damaged by the ground particles. This reduces the failures of the wafer to be found in the following inspection step, and allows a safe bonding process for the electrode pads.

The above and other objects, features and advantages of the present invention will be more apparent from the following description, referring to the accompanying drawings.

DETAILED DESCRIPTION OF THE PREFERRED EMBODIMENTS

Figure 1:
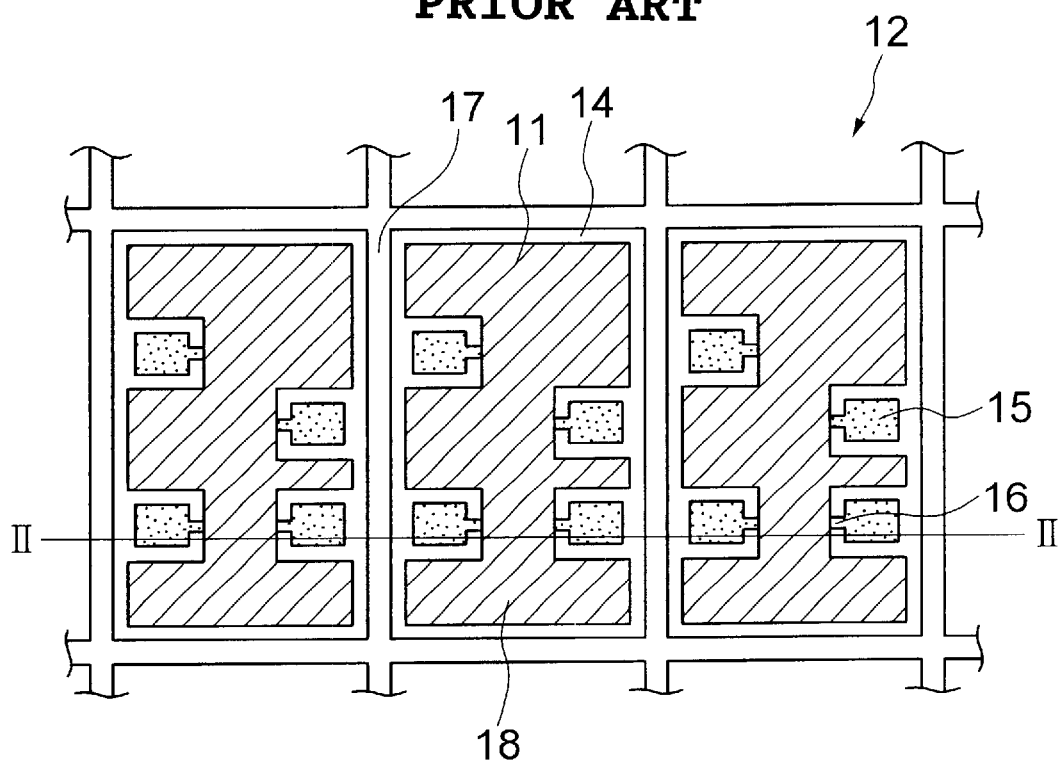
FIG. 1 is a top plan view showing a part of a conventional wafer having thereon polyimide film patterns.
Figure 2:
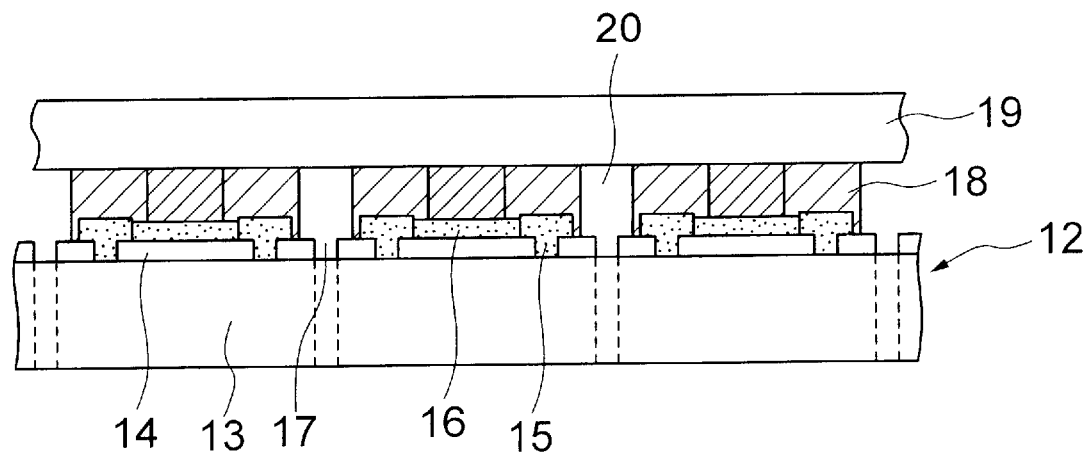
FIG. 2 is a sectional view taken along line II—II shown in FIG. 1.
Figure 3:
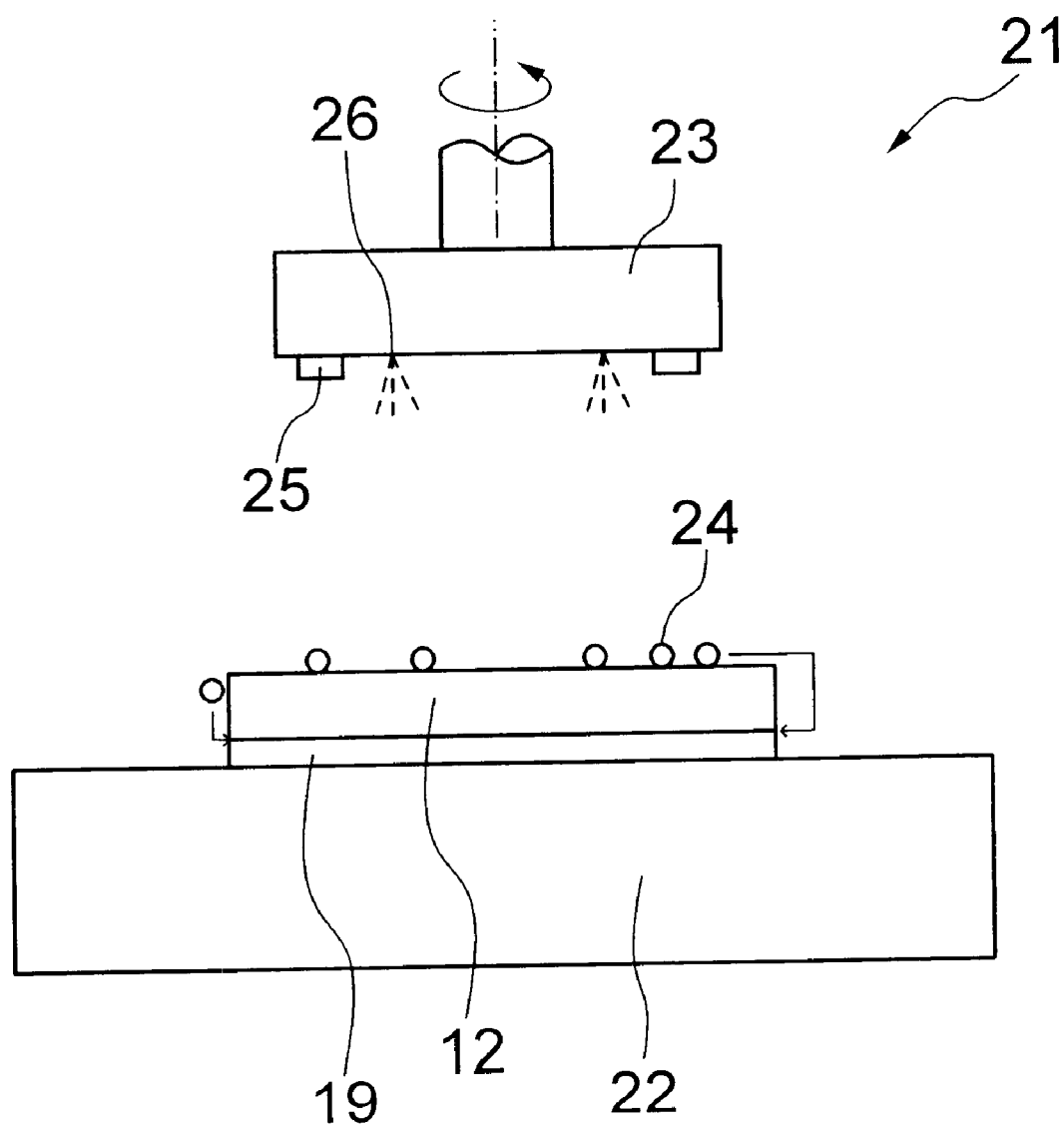
FIG. 3 is a side view showing the essential parts of a grinding position in a bottom surface grinder.

Now, the present invention is more specifically described with reference to accompanying drawings, wherein similar constituent elements are designated by similar reference numerals throughout the drawings.

A wafer having an interconnect pattern thereon and manufactured by a method according to the present invention has a plurality of semiconductor chips 11 arranged in a matrix. On the semiconductor chips 11 are arranged interconnect patterns 16 including electrode pads 15, some of which are in so close proximity to scribe lines 17 that no polyimide film can be formed therebetween.

In the polyimide film forming step, the polyimide film is patterned to form polyimide patterns 30 for protecting the surfaces of the semiconductor chips 11. The polyimide film patterns are left on desired portions excepting such areas as: at least some effective areas of all the electrode pads 15 where the bonding is conducted; the most of the areas for the scribe lines 17; and the narrow areas where the scribe lines 17 and the electrode pads 15 are in so close proximity that no polyimide film can be formed therebetween.

In the bottom surface grinding step subsequent to the patterning of the polyimide film, the bottom surface of the wafer having thereon the polyimide film patterns 11 is ground, while the main surface of the wafer is either directly attached to a table of a bottom surface grinder by vacuum suction, is attached thereto by vacuum suction with a surface protective tape stuck thereon, or is pasted thereto with pasting wax.

The method of fabricating a semiconductor wafer according to a preferred embodiment of the present invention has the following features. That is, at least some of the polyimide film patterns formed in the polyimide film forming steps include bank portions (or banks) which are disposed on the scribe lines in the vicinities of the intersections of two scribe lines extending normal to each other among the scribe lines extending vertically and horizontally to form a lattice. Due to the banks, the scribe lines are partitioned to prevent the ingress of ground particles generated in the bottom surface grinding.

In a first arrangement of the banks, the banks are exclusively formed on the scribe lines in the vicinities of the intersections of two scribe lines extending between a regular chip and an irregular chip and between two irregular chips disposed on the peripheral area of the wafer. The term "regular chip" as used herein means a chip having a complete chip area and formed in the central area of the wafer. The term "irregular chip" as used herein means a chip having an incomplete area and formed in the periphery of the wafer. The irregular chips are discarded after the dicing of the wafer. This arrangement is to reduce to some extent the polyimide film patterns left on the scribe lines, and prevent the ingress of ground particles at the outermost periphery of the wafer. Although reticle patterns should be separately prepared and used for the periphery of the wafer and for other portions, reduction of the lifetime of the dicing blade due to deterioration is lower.

In a second arrangement of the banks, the banks are formed on the scribe lines in the vicinities of all the intersections of the scribe lines, which extend vertically and horizontally forming a lattice. It is clear that the ingress of ground particles is prevented at the external periphery of the wafer. Furthermore, even if the ground particles make an ingress beyond the peripheral bank formed in the vicinity of the outermost intersection of the scribe lines, the provision of the banks for every intersection can minimize the spread of the contamination. In this case, a common reticle pattern can be used both for the external periphery of the wafer and for other portions, although the dicing blade may have a smaller lifetime due to deterioration compared to the first arrangement. The reduction of the lifetime, however, may be suppressed by a smaller width of the banks.

It is to be noted that, when the wafer having thereon polyimide film patterns with the banks according to the present invention is attached by vacuum suction to the suction table of the bottom surface grinder directly or with the surface protective tape stuck thereon, the banks can prevent ground particles from intruding through the gaps between the depressions and the suction table or the gaps between the depressions and the surface protective tape. Moreover, even when the wafer is pasted by using pasting wax, and the depressions are not completely filled with the pasting wax to create gaps, the banks can prevent the ingress of ground particles. The term "depression" as used herein means the area of the wafer wherein the polyimide film pattern is not left.

Figure 4:
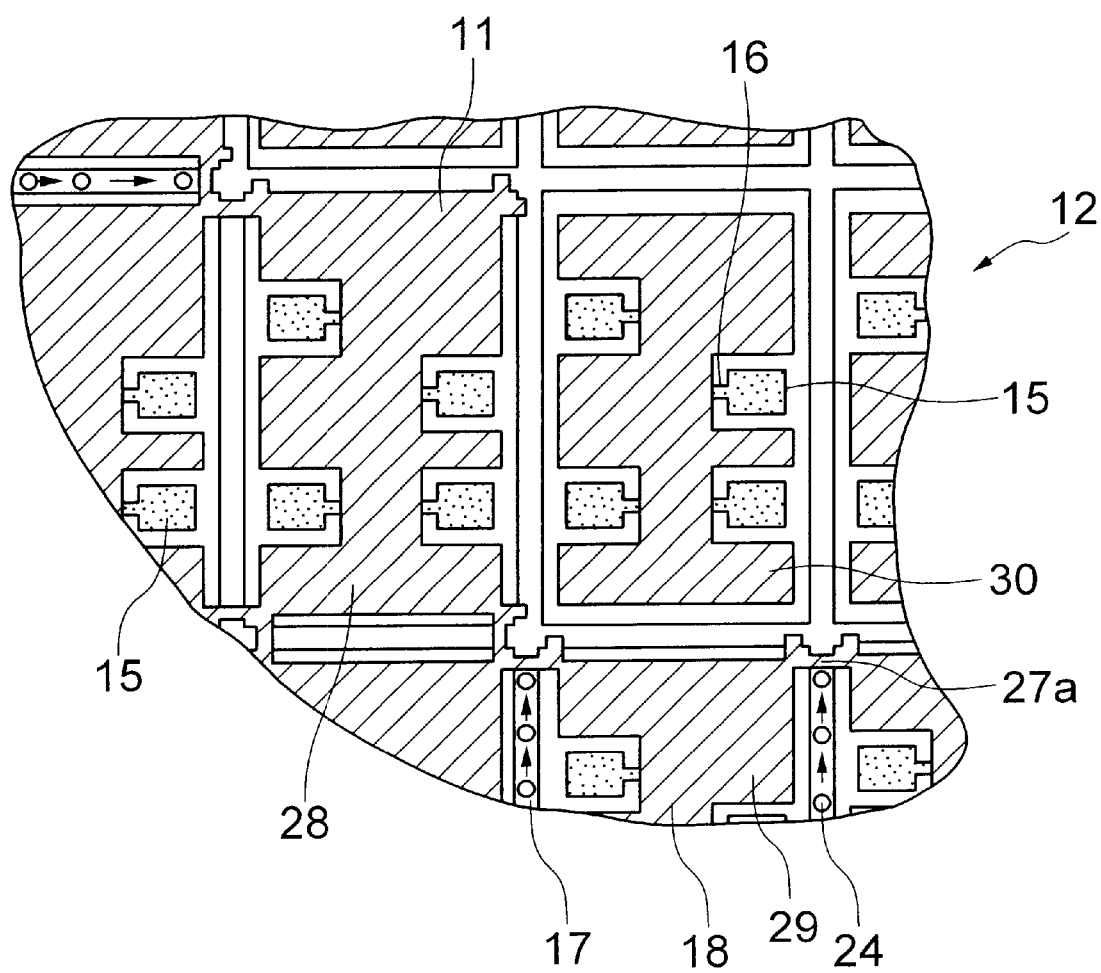
FIG. 4 is a top plan view showing a part of a wafer having thereon polyimide film patterns and fabricated by a method according to a first embodiment of the present invention.

An example of the first arrangement of the banks according to a first embodiment of the present invention will be described with reference to FIG. 4 showing a part of the semiconductor wafer. In the semiconductor wafer, the polyimide film patterns 18 formed in the polyimide film forming step includes banks 27a which cross the scribe lines 17 in the vicinities of the intersections of scribe lines 17 extending vertically and horizontally to form a lattice on the wafer. The banks 27a partition or divide the scribe lines 17 in the extending direction thereof to prevent the ingress of ground particles 24 produced in the bottom surface grinding step along the scribe lines 17.

The banks 27a are exclusively arranged between irregular chips 29 and regular chips 28 or between irregular chips 29 disposed on the periphery of the wafer. The banks 27a are configured so that the polyimide film patterns 18 for protecting the surfaces of regular chips 28 or irregular chips 29 adjacent to one another in every direction on the external periphery of the wafer are connected to one another by the banks 27a. It is to be noted that no bank 27a is formed between regular chips 30 disposed in the central area, i.e., other than the regular chips 28 disposed in the vicinity of the periphery of the wafer. It is to be noted in FIG. 4 that none of the banks 27a is formed within the intersections for obtaining a smaller width of the banks 27a. However, in order to increase the strength of the banks 27a, the banks 27a may be formed within the entire areas for the intersections. The first arrangement of the banks 27a reduces the number of polyimide film patterns 18 left on the scribe lines 17 to some extent while preventing the ingress of the ground particles 24 at the external periphery of the wafer. However, the reticle patterns should be separately prepared and selectively used for the regular chips 28 and irregular chips 29 on the external periphery of the wafer and for other regular chips 30.

The semiconductor wafer fabricated by the present fabrication method has the banks 27a only in the vicinities of the outermost intersections of the scribe lines 17 between the regular chips 28 and irregular chips 29 or between the irregular chips adjacent to one another in every direction. The arrangement of these banks 27a prevents the ingress of the ground particles 24 produced during the bottom surface grinding step.

An example of the second arrangement of the banks according to a second embodiment of the present invention will be described with reference to FIG. 5, which shows a semiconductor wafer similarly to FIG. 4. In the semiconductor wafer, the polyimide film patterns 18 formed in the polyimide film forming step includes banks 27b which are disposed in the vicinities of all the intersections of scribe lines 17, which extend vertically and horizontally forming a lattice. This arrangement partitions or divides the scribe lines 17 in the extending direction of the scribe lines to prevent the ingress of ground particles 24 produced in the bottom surface grinding step along the scribe lines 17. The banks 27b are configured so that the polyimide film patterns 18 for protecting the surfaces of all the regular chips 28 and 23 and irregular chips 29 adjacent to one another in every direction are bridged by the banks 27b.

Figure 5:
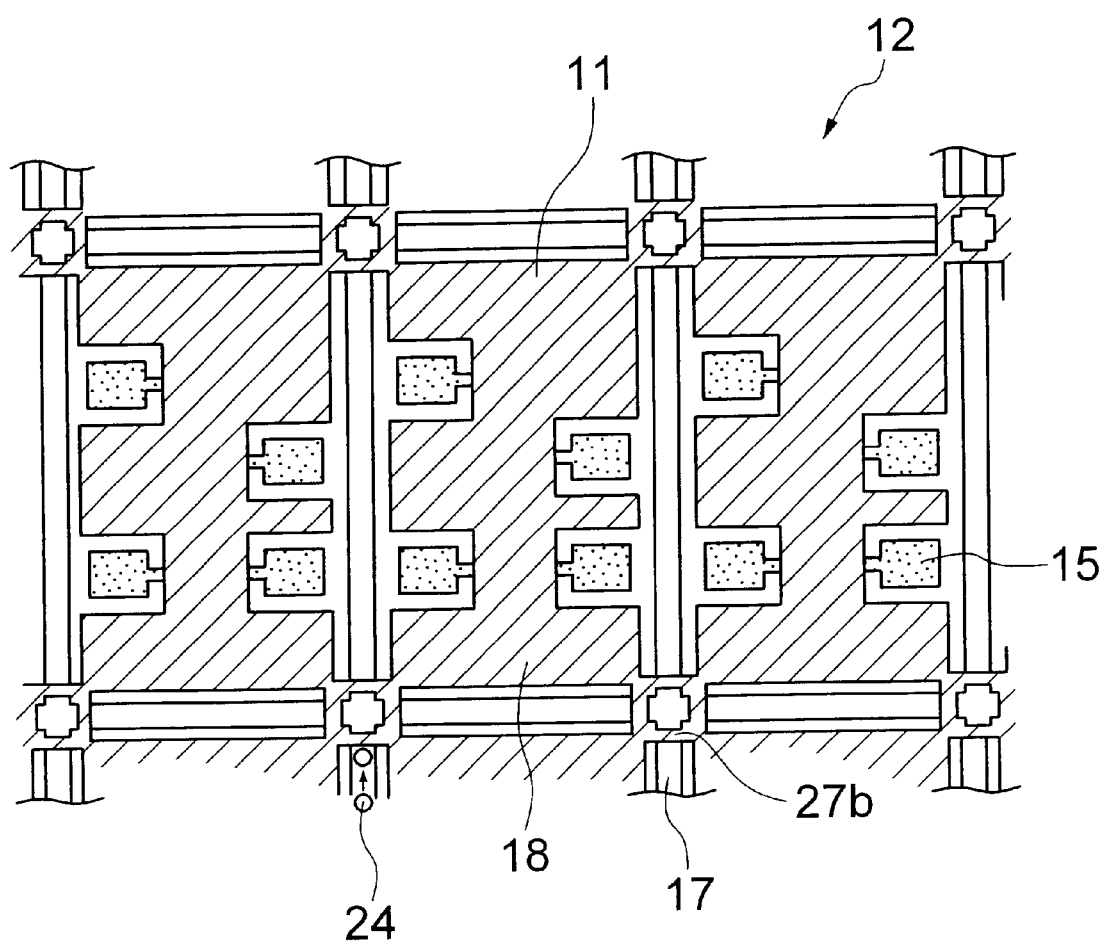
FIG. 5 is a top plan view showing a part of a wafer having thereon polyimide film patterns and fabricated by a method according to a second embodiment of the present invention.

In FIG. 5, the banks 27b are arranged on a one-to-one basis on all the scribe lines 17 extending in four ways from the intersections. However, the number of banks 27b formed on every scribe line 17 may be one. It is to be noted that none of the banks 27b is formed within the intersections so as to reduce the width of the banks 27b for the sake of avoiding earlier deterioration of the dicing blade. However, in order to enhance the strength of the banks 27b, the banks 27b may be expanded toward within the intersection to have a larger width.

The semiconductor wafer fabricated by the fabrication method of the present embodiment has the banks 27b in the vicinities of all the intersections of the scribe lines 17, which extend vertically and horizontally to form a lattice. The banks 27b prevent the ingress of the ground particles 24 produced in the bottom surface grinding step. In addition, even if the ground particles 24 make an ingress beyond the banks 27b on the outermost peripheries of the wafer, the provision of the banks 27b for every intersections can minimize the damage or spread of the contamination.

The thickness of the bank is substantially equal to the thickness of the polyimide film pattern formed on the chip due to the common steps for fabrication of the polyimide film pattern including the bank.

Since the above embodiments are described only for examples, the present invention is not limited to the above embodiments and various modifications or alterations can be easily made therefrom by those skilled in the art without departing from the scope of the present invention.

What is claimed is:

1. A method for fabricating a semiconductor wafer comprising:

forming a wafer having a plurality of semiconductor chips arranged in a matrix and a plurality of scribe lines separating said semiconductor chips from one another, each of said semiconductor chips including an interconnect pattern having electrode pads;

forming an overcoat film pattern on each of said semiconductor chips except for at least effective areas for said electrode pads, said overcoat film pattern having a plurality of bank portions bridging said overcoat film pattern and an adjacent overcoat film pattern while crossing one of said scribe lines; and grinding a bottom surface of said wafer, wherein said bank portions are disposed in a vicinity of each outermost intersection formed by two of said scribe lines extending normal to one another.

2. The method as defined in claim 1, wherein said bank portions are disposed in a vicinity of all of said intersections formed by each of said scribe lines extending normal to one another.

3. The method as defined in claim 1, wherein said overcoat pattern is made of polyimide.

4. A semiconductor wafer comprising: a plurality of semiconductor chips arranged in a matrix and each having an interconnect pattern including electrode pads and an overcoat film for covering said semiconductor chip except for at least parts of said electrode pads; and a plurality of scribe lines for separating said semiconductor chips from one another, said overcoat film having a plurality of bank portions bridging said overcoat films and adjacent overcoat films while crossing said scribe lines, wherein said bank portions are disposed in a vicinity of each outermost intersection formed by said scribe lines extending normal to one another.

5. The semiconductor wafer as defined in claim 4, wherein said bank portions are disposed in a vicinity of each of said intersections formed by said scribe lines extending normal to one another.

6. The semiconductor wafer as defined in claim 4, wherein said overcoat film pattern is made of polyimide.

* * * * *